United States Patent
Lanowitz et al.

(10) Patent No.: US 7,005,872 B1
(45) Date of Patent: Feb. 28, 2006

(54) SYSTEM FOR REMOVING DEBRIS FROM A TEST SOCKET

(75) Inventors: Mark Lanowitz, Kernersville, NC (US); James Migliaccio, Colfax, NC (US); Jerome Ferr, Greensboro, NC (US); Jeffrey Read, High Point, NC (US)

(73) Assignee: RF Micro Devices, Inc., Greensboro, NC (US)

(*) Notice: Subject to any disclaimer, the term of this patent is extended or adjusted under 35 U.S.C. 154(b) by 0 days.

(21) Appl. No.: 11/053,218

(22) Filed: Feb. 8, 2005

(51) Int. Cl.
*G01R 31/02* (2006.01)
*B08B 9/00* (2006.01)
*B08B 7/04* (2006.01)
*B08B 3/00* (2006.01)
*A47L 15/00* (2006.01)

(52) U.S. Cl. .......................... 324/763; 134/30; 134/37; 134/34; 134/22.18; 134/22.12; 15/303; 15/316.1

(58) Field of Classification Search ...................... None
See application file for complete search history.

(56) References Cited

U.S. PATENT DOCUMENTS 6,799,584 B1 * 10/2004 Yogev et al. ................ 134/1.3

* cited by examiner

*Primary Examiner*—Zandra V. Smith
*Assistant Examiner*—Roberto Velez
(74) *Attorney, Agent, or Firm*—Withrow & Terranova, PLLC

(57) ABSTRACT

A test fixture for an electronic device is provided that removes debris from a socket of the test fixture using back side air blow off. In general, the test fixture includes a circuit board, a socket on a front side of the circuit board, and an air manifold on a back side of the circuit board. Pressurized air is provided to the air manifold through an air supply inlet coupling the air manifold to an external pressurized air supply. At least one via formed through the circuit board fluidly couples the air manifold on the back side of the circuit board to the socket on the front side of the circuit board. Accordingly, the pressurized air from the air manifold flows through the vias and up through the socket such that debris is removed from the socket.

20 Claims, 3 Drawing Sheets

SYSTEM FOR REMOVING DEBRIS FROM A TEST SOCKET

FIELD OF THE INVENTION

The present invention relates to a test fixture for testing an electronic device, and more particularly relates to a test fixture having back side air blow off to remove debris from a socket of the test fixture.

BACKGROUND OF THE INVENTION

It is common practice in the electronics industry to test electronic devices using a test fixture. These test fixtures include a socket into which the electronic device is inserted during testing. However, when an electronic device is inserted into the socket, pieces of molding compound often break free from the edges of the electronic device and accumulate within the socket. As numerous electronic devices are tested, debris, which is predominately pieces of molding compound from previously tested electronic devices, rapidly accumulates within the socket and adversely affects the performance of the test fixture.

The traditional approach to removing debris from the socket is to blow air down into the socket while no device is within the socket. However, while this approach removes some of the debris from the socket, other pieces of the debris are forced deeper into the contact interface of the socket. This is especially true for sockets having a micro-strip contact interface.

Another approach for preventing the accumulation of debris within the socket is to blow air on the electronic devices before placing them into the socket. This approach attempts to remove loose pieces of the molding compound from the electronic devices prior to inserting the devices into the socket. However, this approach does not effectively prevent debris from accumulating in the socket. Molding compound still breaks free when inserting the electronic devices into the socket, and, over time, the debris adversely affects the performance of the test fixture. Thus, there remains a need for a system and method for effectively removing debris from a socket of a test fixture for testing electronic devices.

SUMMARY OF THE INVENTION

The present invention provides a test fixture for testing an electronic device that removes debris from a socket of the test fixture by blowing air from a back side of the test fixture outward from the socket. In general, the test fixture includes a circuit board, a socket on a front side of the circuit board, and an air manifold on a back side of the circuit board. The socket includes electric contacts for electrically connecting an electronic device to the circuit board when the electronic device is inserted into the socket. Pressurized air is provided to the air manifold through an air supply inlet that couples the air manifold to an external pressurized air supply. At least one via formed through the circuit board fluidly couples the air manifold on the back side of the circuit board to the socket on the front side of the circuit board. Accordingly, the pressurized air from the air manifold flows through the vias and up through the socket such that debris is removed from the socket.

In one embodiment, the pressurized air is provided to the air manifold continuously such that a positive pressure is created in the socket while inserting the electronic device into the socket, while testing the electronic device, and while removing the electronic device from the socket. Alternatively, the pressurized air is provided to the air manifold only while inserting the electronic device into the socket and removing the electronic device from the socket. As yet another alternative, the pressurized air is provided to the air manifold only while inserting the electronic device into the socket or removing the electronic device from the socket.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
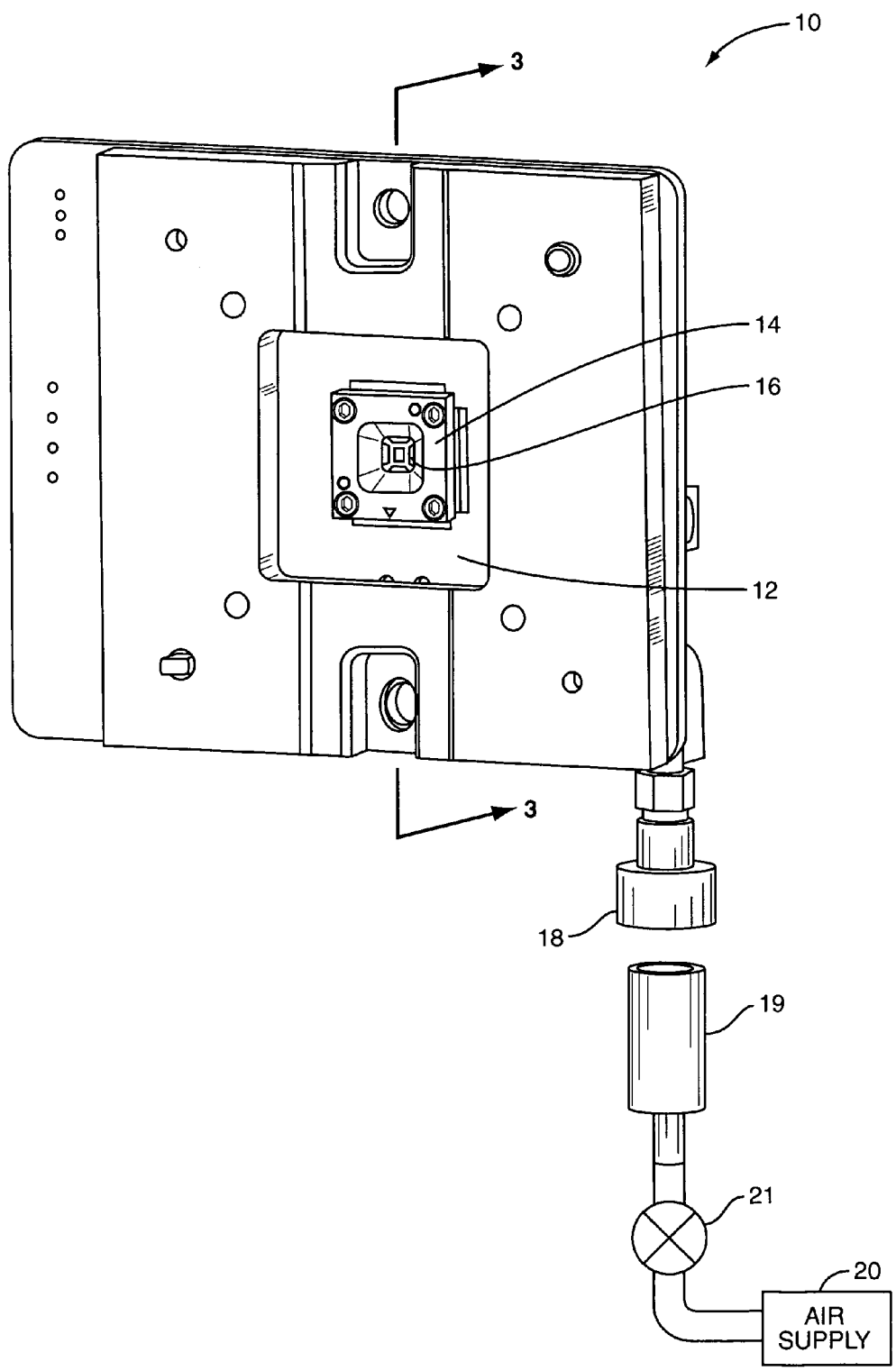
FIG. 1 illustrates a top-down view of an exemplary embodiment of a test fixture for an electronic component having back side blow off to remove debris from a socket of the test fixture according to the present invention.

The present invention provides a test fixture that removes debris from a socket of the test fixture by blowing air from a back side of the test fixture outward from the socket. A top-down view showing a front side of an exemplary embodiment of a test fixture 10 of the present invention is illustrated in FIG. 1. In general, the test fixture 10 includes printed circuit board (PCB) 12, a socket 14 for connecting an electronic device to the PCB 12, contacts 16 within the socket 14 for electrically connecting contacts of the electronic device to the PCB 12, and an air supply inlet 18. The air supply inlet 18 is coupled to an outlet 19 of an air supply device 20 such that pressurized air is provided to an air manifold (FIG. 2) of the test fixture 10. The air supply device 20 may be any type of device capable of providing the pressurized air to the test fixture 10, such as, but not limited to, an air pump. In one embodiment, the pressurized air is provided in the range including 10–20 pounds per square inch (PSI). However, this range is exemplary and should not be construed to limit the scope of the present invention. The pressurized air may be provided at any pressure as needed or desired.

In addition, a control valve 21 may be used to control the flow of the pressurized air from the air supply 20. The control valve 21 may be controlled manually or by an external controller to control the flow of the pressurized air from the air supply 20 to the air supply inlet 18 of the test fixture 10. However, the control valve 21 is optional and is not a necessary element of the present invention.

In operation, the pressurized air flows from the back side of the test fixture 10 and outward from the socket 14, thereby blowing any debris from the socket 14. It should be noted that the pressurized air flows outward from the socket 14 rather than into the socket 14. As such, debris is effectively removed from the socket 14 rather than forced deeper into the socket 14.

Figure 2:
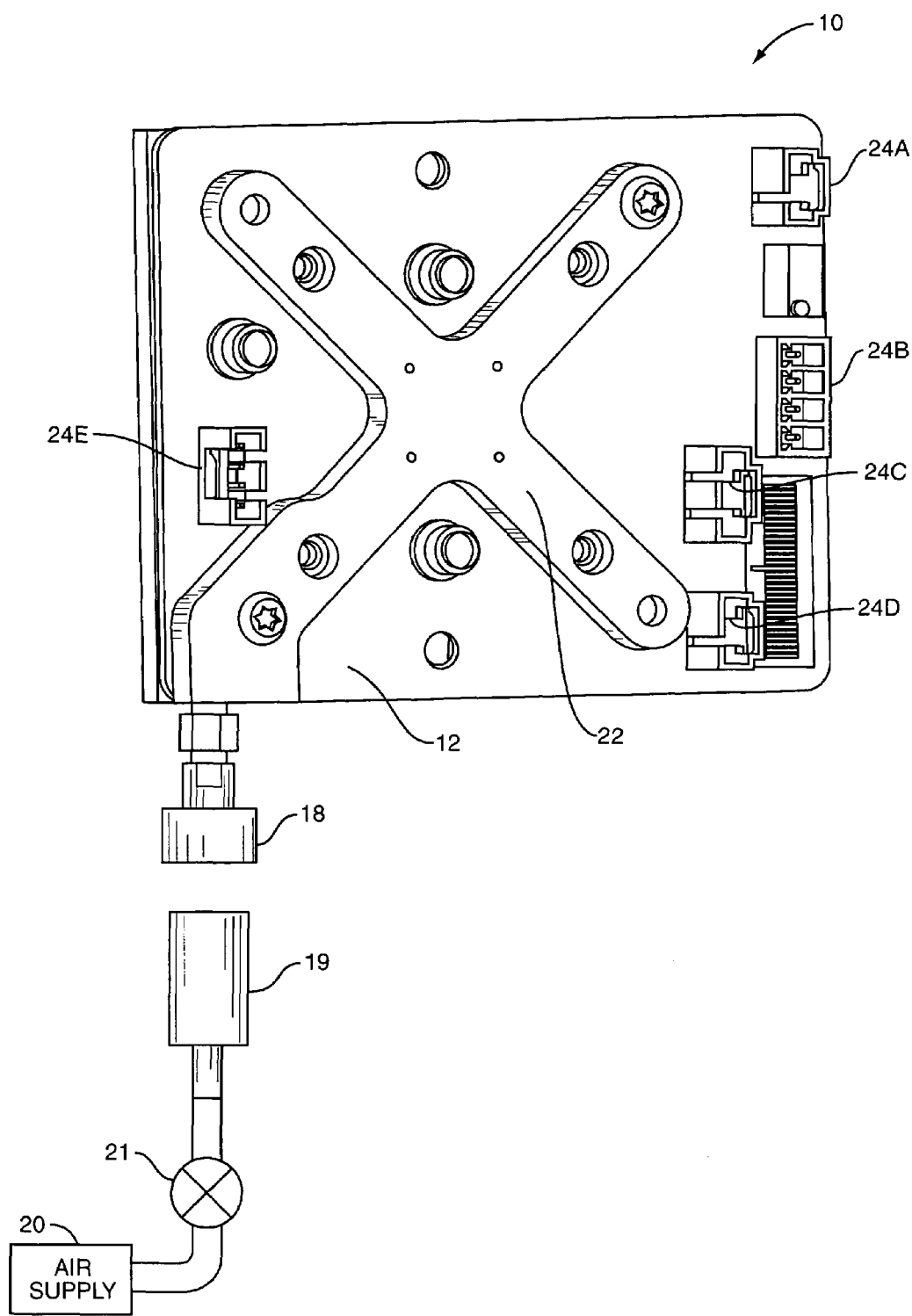
FIG. 2 illustrates a bottom-up view of the exemplary test fixture illustrated in FIG. 1 according to one embodiment of the present invention.

FIG. 2 is a bottom-up illustration showing a back side of the test fixture 10 of FIG. 1. In addition to the elements shown in FIG. 1, the test fixture 10 includes an air manifold 22 and various electrical connections 24A–24E, generally referred to as electrical connections 24. The electrical connections 24 provide a means for connecting the PCB 12, and thus an electronic device inserted into the socket 14 (FIG. 1), to external devices (not shown) during testing. The external devices may provide data, power, or some other signal to an electronic device inserted into the socket 14, or receive data or some other signal from an electronic device inserted into the socket 14 via the PCB 12.

As discussed above, pressurized air is provided to the test fixture 10 through the air supply inlet 18. The air supply inlet 18 is fluidly connected to the air manifold 22 such that the pressurized air flows through the air supply inlet 18 into the air manifold 22. Once in the air manifold 22, the pressurized air flows from the air manifold 22, through the PCB 12, and into the socket 14 (FIG. 1) such that debris blown outward from the socket 14 (FIG. 1).

Figure 3:
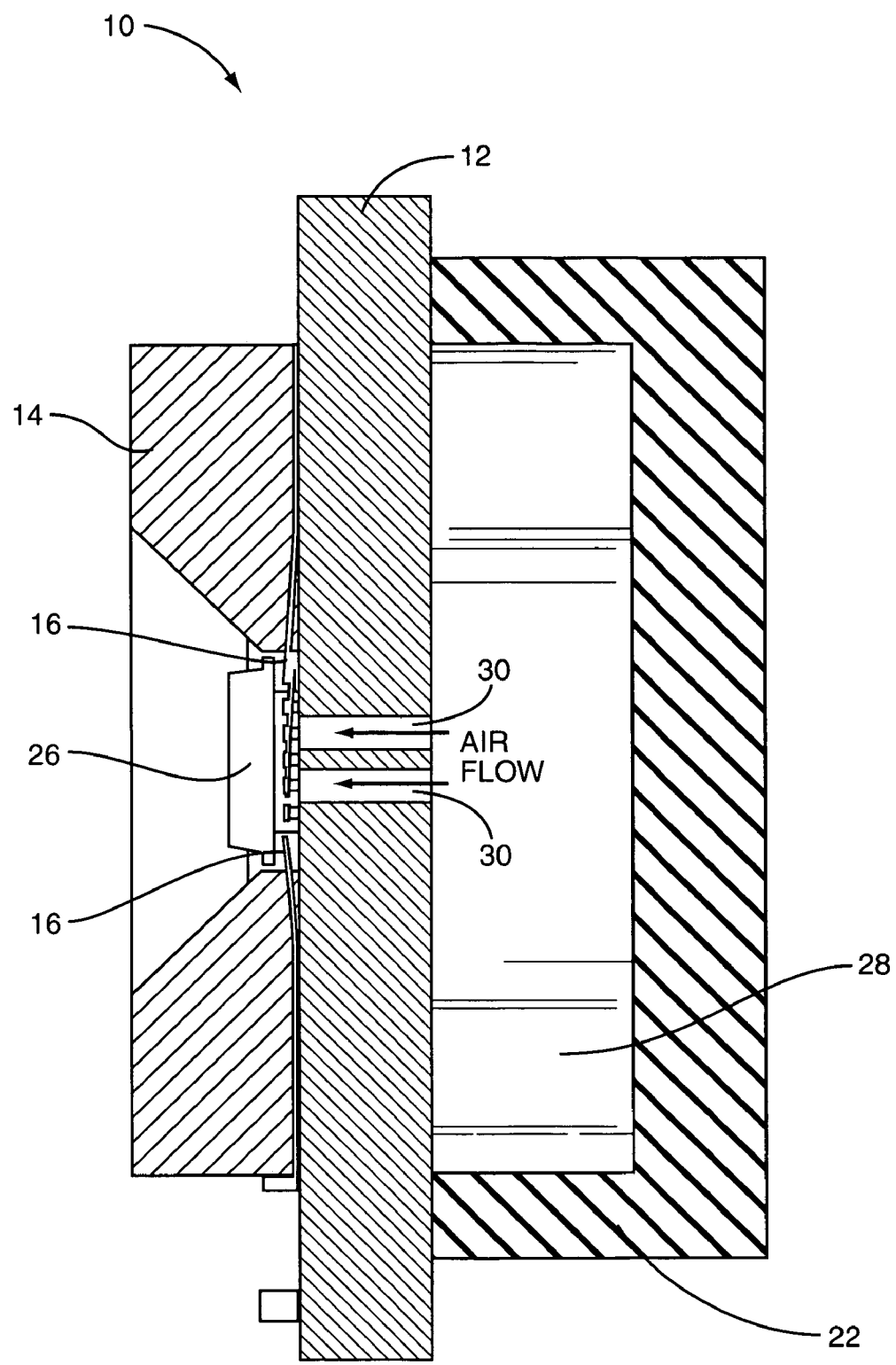
FIG. 3 illustrates a cross-sectional view of the exemplary test fixture illustrated in FIGS. 1 and 2 according to one embodiment of the present invention.

FIG. 3 is a cross-sectional illustration of the test fixture 10 of FIGS. 1 and 2 along axis 3 (FIG. 1). When an electronic device 26 is inserted into the socket 14, molding around the edges of the electronic device 26 may break free. Under normal circumstances, the pieces of the molding that broke free would accumulate in the socket 14. Over time, this debris would adversely affect the electrical connection between contacts of the electronic device 26 and the contacts 16 within the socket 14. As a result, the performance of the test fixture 10 would be significantly reduced.

According to the present invention, molding that breaks free from the edges of the electronic device 26, or any other type of debris that falls into the socket 14, is blown from the socket 14 by the pressurized air from the air manifold 22, and more particularly from a volume 28 formed by the air manifold 22. As illustrated, one or more vias 30 formed through the PCB 12 fluidly couple the air manifold 22 on a back side of the PCB 12 to the socket 14 on the front side of the PCB 12. More specifically, the volume 28 within the air manifold 22 is fluidly coupled to the socket 14 by the vias 30. Accordingly, the pressurized air from the air manifold 22 flows from the air manifold 22, up through the vias 30, and into the socket 14, thereby blowing any debris from the socket 14. It should be noted that the volume of air flow is controlled by the diameter of the vias 30. As such, the diameter of the vias 30 may be predetermined such that the desired volume of air flow is achieved.

In operation, the pressurized air may be provided from the air supply device 20 into the air manifold 22 through the air supply inlet 18 (FIGS. 1 and 2) while the electronic device 26 is placed into the socket 14, while the electronic device 26 is in the socket 14, and/or while the electronic device is removed from the socket 14. Thus, there may be continuous air flow through the air supply inlet 18, into the air manifold 22, through the vias 30, and up through the socket 14. Alternatively, the pressurized air may be provided to the air manifold 22 only while placing the electronic device 26 into and removing the electronic device 26 from the socket 14. As yet another alternative, the pressurized air may be provided to the air manifold 22 only while placing the electronic device 26 into the socket 14.

The present invention provides substantial opportunity or variation without departing from the spirit or scope of the present invention. For example, although the contacts 16 are illustrated as micro-strip contacts, the contacts 16 may be any type of electrical contacts such as, but not limited to, micro-strip contacts, pogo pin contacts, or rocker style contacts. Further, although the test fixture 10 is illustrated as having a particular design in FIGS. 1 and 2, the test fixture 10 may have any design as long as the pressurized air flows out of the socket 14 rather than into the socket 14. Thus, the air manifold 22 may alternatively be located on the front side of the PCB 12 or to the side of the PCB 12 as long as the pressurized air is directed out of the socket 14. As yet another embodiment, the air supply inlet 18 may be directly below the vias 30, such that the air supply inlet 18 also forms the air manifold 22.

Those skilled in the art will recognize improvements and modifications to the preferred embodiments of the present invention. All such improvements and modifications are considered within the scope of the concepts disclosed herein and the claims that follow.

What is claimed is:

1. A test fixture for testing an electronic device comprising:
   a circuit board;
   a socket on a front side of the circuit board and comprising electrical contacts for electrically connecting an electronic device inserted into the socket to the circuit board;
   at least one via formed through the circuit board and providing at least one opening that couples the socket on the front side of the circuit board to a back side of the circuit board; and
   an air manifold adapted to receive pressurized air through an air supply inlet and direct the pressurized air from the back side of the circuit board to the socket on the front side of the circuit board through the at least one via such that the pressurized air flows outward from the socket, thereby removing debris from the socket.

2. The test fixture of claim 1 wherein the air manifold is on the back side of the circuit board such that the pressurized air is directed from the air manifold on the back side of the circuit board, through the at least one via, and outward from the socket.

3. The test fixture of claim 1 wherein the pressurized air is provided while inserting the electronic device into the socket.

4. The test fixture of claim 1 wherein the pressurized air is provided while inserting the electronic device into the socket and removing the electronic device from the socket.

5. The test fixture of claim 1 wherein the pressurized air is provided while removing the electronic device from the socket.

6. The test fixture of claim 1 wherein the pressurized air is provided continuously while inserting the electronic device into the socket, testing the electronic device, and removing the electronic device from the socket.

7. The test fixture of claim 1 wherein the electrical contacts are micro-strip contacts.

8. The test fixture of claim 1 wherein a diameter of the at least one via is predetermined such that a desired volume of air flow is achieved from the air manifold to the socket.

9. The test fixture of claim 1 wherein the test fixture is included in a testing system further comprising a means for supplying the pressurized air.

10. The test fixture of claim 9 further comprising a control valve having an inlet coupled to the means for supplying the pressurized air and an outlet coupled to the air supply inlet.

11. The test fixture of claim 1 wherein the pressurized air is provided such that the pressurized air has a pressure in a range including 10–20 pounds per square inch.

12. A method of removing debris from a socket of a test fixture for testing an electronic device comprising:

providing pressurized air to an air manifold of a test fixture, the test fixture including the air manifold, a circuit board, a socket on a front side of the circuit board, and at least one via providing at least one opening that couples a back side of the circuit board to the socket on the front side of the circuit board; and directing the pressurized air from the air manifold through at least one via from the back side of the circuit board to the socket on the front side of the circuit board such that debris is blown outward from the socket.

13. The method of claim 12 wherein providing the pressurized air to the air manifold comprises providing the pressurized air to the air manifold located on the back side of the circuit board, wherein the at least one via fluidly couples the air manifold located on the back side of the circuit board to the socket on the front side of the circuit board.

14. The method of claim 12 further comprising providing the pressurized air while inserting the electronic device into the socket.

15. The method of claim 12 further comprising providing the pressurized air while inserting the electronic device into the socket and removing the electronic device from the socket.

16. The method of claim 12 further comprising continuously providing the pressurized air while inserting the electronic device into the socket, testing the electronic device, and removing the electronic device from the socket.

17. The method of claim 12 further comprising providing the pressurized air while removing the electronic device from the socket.

18. The method of claim 12 further comprising predetermining a diameter of the at least one via such that a desired volume of air flow is achieved.

19. The method of claim 12 wherein providing the pressurized air to the air manifold comprises providing the pressurized air such that the pressurized air has a pressure in a range including 10–20 pounds per square inch.

20. A test fixture for testing an electronic device comprising:

a circuit board;

a socket on a front side of the circuit board and comprising electrical contacts for electrically connecting an electronic device inserted into the socket to the circuit board; and means for receiving pressurized air and directing the pressurized air from a back side of the circuit board to the socket on the front side of the circuit board such that the pressurized air flows outward from the socket, thereby removing debris from the socket.

* * * * *